(12) United States Patent
Nishiguchi

(10) Patent No.: US 11,171,005 B2
(45) Date of Patent: Nov. 9, 2021

(54) SEMICONDUCTOR DEVICE MANUFACTURING METHOD

(71) Applicant: Mitsubishi Electric Corporation, Tokyo (JP)

(72) Inventor: Kohei Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/500,334

(22) PCT Filed: Jun. 7, 2017

(86) PCT No.: PCT/JP2017/021168
§ 371 (c)(1),
(2) Date: Oct. 2, 2019

(87) PCT Pub. No.: WO2018/225195
PCT Pub. Date: Dec. 13, 2018

(65) Prior Publication Data
US 2020/0357644 A1  Nov. 12, 2020

(51) Int. Cl.
*H01L 21/288* (2006.01)
*H01L 21/027* (2006.01)
(Continued)

(52) U.S. Cl.
CPC ........ *H01L 21/288* (2013.01); *H01L 21/0272* (2013.01); *H01L 21/28581* (2013.01);
(Continued)

(58) Field of Classification Search
CPC ............... H01L 21/288; H01L 21/0272; H01L 21/28587
See application file for complete search history.

(56) References Cited

U.S. PATENT DOCUMENTS

2012/0012858 A1   1/2012  Inoue
2012/0146107 A1*  6/2012  Lim ..................... H01L 29/402
                                                           257/288
(Continued)

FOREIGN PATENT DOCUMENTS

JP    H05-315321 A   11/1993
JP    H07-183312 A    7/1995
(Continued)

OTHER PUBLICATIONS

International Search Report; Written Opinion; and Notification of Transmittal of The International Search Report and the Written Opinion of the International Searching Authority, or the Declaration issued in PCT/JP2017/021168; dated Jul. 25, 2017.
Office Action issued in JP 2017-552104; mailed by the Japanese Patent Office dated Dec. 19, 2017.

*Primary Examiner* — Michele Fan
(74) *Attorney, Agent, or Firm* — Studebaker & Brackett PC

(57) ABSTRACT

Included are forming, on a semiconductor substrate, an insulation film having an opening section where an opening is formed, forming a first resist on the insulation film while avoiding the opening section and the semiconductor substrate exposed via the opening section, forming a first metal on the opening section, the semiconductor substrate exposed via the opening section, and the first resist by a vapor deposition method or a sputtering method, removing, by a lift-off method, the first resist and the first metal on the first resist, forming, on the insulation film, a second resist allowing the first metal to be exposed, causing the first metal to grow a second metal by an electroless plating method, and removing the second resist, where these processings are included in the listed order.

9 Claims, 9 Drawing Sheets

(51) Int. Cl.
  *H01L 21/285*  (2006.01)
  *H01L 29/20*  (2006.01)
  *H01L 29/423*  (2006.01)
  *H01L 29/47*  (2006.01)
  *H01L 29/66*  (2006.01)
  *H01L 29/778*  (2006.01)

(52) U.S. Cl.
  CPC .... *H01L 21/28587* (2013.01); *H01L 29/2003* (2013.01); *H01L 29/42316* (2013.01); *H01L 29/475* (2013.01); *H01L 29/66462* (2013.01); *H01L 29/7786* (2013.01)

(56) References Cited

U.S. PATENT DOCUMENTS

| | | |
|---|---|---|
| 2014/0001640 A1 | 1/2014 | Nishizawa |
| 2015/0247758 A1* | 9/2015 | Kurth ..................... G01J 5/024 250/349 |

FOREIGN PATENT DOCUMENTS

| | | |
|---|---|---|
| JP | H10-154667 A | 6/1998 |
| JP | H11-016925 A | 1/1999 |
| JP | 2005-251835 A | 9/2005 |
| JP | 2010-135542 A | 6/2010 |
| JP | 2012-023210 A | 2/2012 |
| JP | 2014-011350 A | 1/2014 |

* cited by examiner

SEMICONDUCTOR DEVICE MANUFACTURING METHOD

FIELD

This invention relates to a method of manufacturing a semiconductor device.

BACKGROUND

Patent Literature 1 discloses techniques for enhancing shape control of a T-type gate electrode against variation in resist film thickness or light exposure in response to exposure of a multilayer film in a fine T-type gate process employing multi-layer resist, and preventing degradation in the high frequency characteristics of a high frequency device. More specifically, Patent Literature 1 discloses that a fine resist aperture pattern is formed of a single layer EB resist on a semiconductor substrate, a first metallic thin film is formed on the entire surface, and a second resist is applied to form an opening pattern at the umbrella part of a T-type gate. After that, plating of a second metal film is performed at the opening section of the umbrella part using the first metal thin film as a plating electrode, the resist is removed, the first metal thin film of an underlying layer is removed using the second metal at the umbrella part as a mask, and then the first resist is removed to form a T-type gate.

PRIOR ART

Patent Literature

Patent Literature 1: JP2005-251835A

SUMMARY

Technical Problem

For example, in a high frequency device using a compound semiconductor such as gallium arsenide (GaAs) and gallium nitride (GaN), for the purpose of improvement in a high frequency characteristic, a gate length of a gate electrode may be shortened or a gate resistance may be reduced. Either of the following two methods is often adopted in order to form a gate electrode on a semiconductor substrate.

A first method includes forming a feeding layer film on an entire surface of a wafer, forming a resist pattern for forming a gate electrode, carrying out electrolytic plating, and removing the unnecessary portion of the feeding layer film. A second method includes forming a resist pattern for forming a gate electrode, forming a film of an electrode material, and removing an unnecessary portion thereof by lift-off.

According to the first method, damage to the semiconductor substrate may be caused due to the dry etching for removing the feeding layer, which leads to degradation in device characteristics such as a transistor characteristic. In order to avoid the damage due to the dry etching, a method exists that sandwiches an insulation film between a semiconductor substrate and a gate electrode. However, because of the insulation film, parasitic capacitance increases, which causes degradation in transistor characteristics.

According to the second method, sine the electrode material is formed by vapor deposition or sputtering, footing occurs at the base of the gate electrode. Footing refers to an undesired elongated portion extending in a transverse direction. When footing occurs at the base of the gate electrode, the size of the effective gate electrode increases, which causes increase in the parasitic capacitance. Also, in response to miniaturization of the gate electrode, the thickness of the resist used in the lift-off method cannot be increased, so that the height of the gate electrode is reduced. When the height of the gate electrode cannot be ensured to a certain degree, the gate resistance cannot be reduced.

The present invention has been made to solve the above-described problems and an object of the present invention is to provide a method of manufacturing a semiconductor device that can suppress damage to a semiconductor substrate, suppress footing of the gate electrode, and ensure the height of the gate electrode.

Means for Solving the Problems

In this invention, a method of manufacturing a semiconductor device includes in order of a step of forming, on a semiconductor substrate, an insulation film having an opening section where an opening is formed, a step of forming a first resist on the insulation film while avoiding the opening section and the semiconductor substrate exposed via the opening section, a step of forming a first metal on the opening section, the semiconductor substrate exposed via the opening section, and the first resist by a vapor deposition method or a sputtering method, a step of removing, by a lift-off method, the first resist and the first metal on the first resist, a step of forming, on the insulation film, a second resist allowing the first metal to be exposed, a step of causing the first metal to grow a second metal by an electroless plating method, and a step of removing the second resist.

Other features of this invention will be disclosed below.

Advantageous Effects of Invention

According to this invention, since the gate electrode is in its most part formed by electroless plating, damage to the semiconductor substrate can be suppressed, footing of the gate electrode can be suppressed, and the height of the gate electrode can be ensured.

DESCRIPTION OF EMBODIMENTS

A method of manufacturing a semiconductor device in accordance with an embodiment will be described hereinbelow with reference to the drawings. The same reference signs will be assigned to the same or corresponding components, and repeated explanations of which may be omitted.

Embodiment 1

Figure 1:
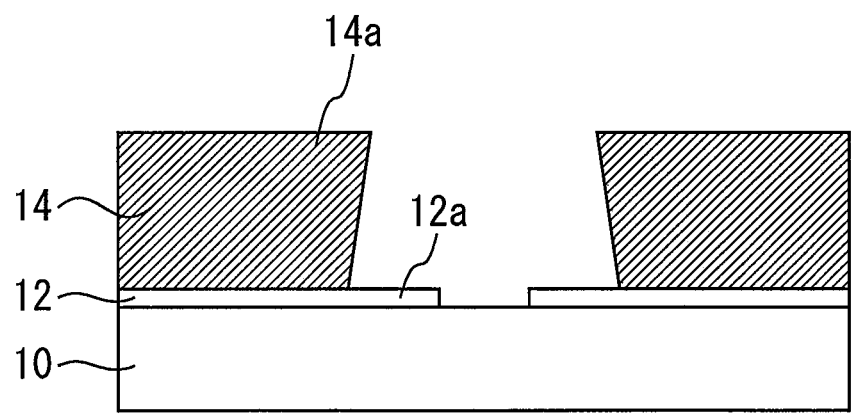
FIG. 1 is a cross-sectional view illustrating a method of manufacturing a semiconductor device in accordance with Embodiment 1.

FIG. 1 is a cross-sectional view that illustrates an initial step of a method of manufacturing a semiconductor device in accordance with Embodiment 1. A plurality of semiconductor layers are formed on the semiconductor substrate 10. The material of the semiconductor substrate 10 is preferably made of a compound semiconductor, for example, such as gallium nitride (GaN) and aluminum gallium nitride (AlGaN). Although it is not limited in particular, a high electron mobility transistor (HEMT) is formed on the semiconductor substrate 10. An insulation film 12 having an opening section 12a where an opening is formed is to be formed on this semiconductor substrate 10. The material of the insulation film 12 is, for example, silicon mononitride (SiN). The insulation film 12 may be formed by another insulating material. The opening section 12a is a section as a part of the insulation film 12 where an opening is formed.

A first resist 14 is to be formed on this insulation film 12. Specifically, the first resist 14 is to be formed on the insulation film 12 while avoiding the opening section 12a and the semiconductor substrate 10 exposed via the opening section 12a. The opening width of the first resist 14 is preferably made larger in response to the first resist 14 being closer to the semiconductor substrate 10. Such a resist shape is called "reverse tapered" shape.

Figure 2:
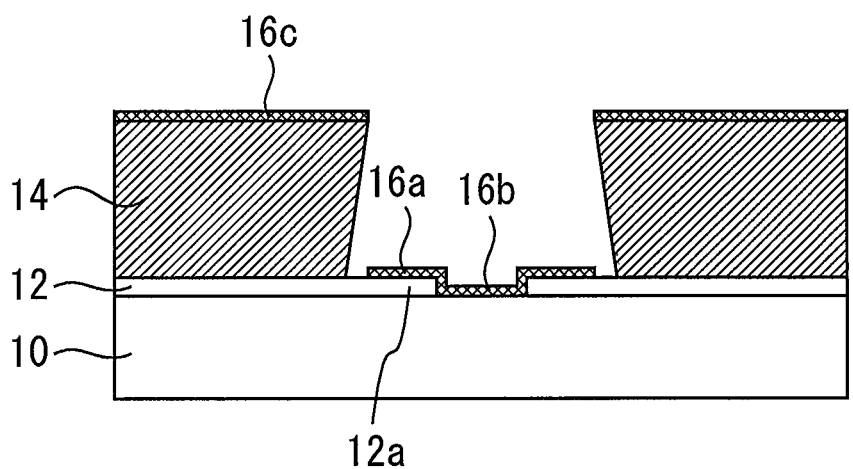
FIG. 2 is a cross-sectional view of the first metals.

Subsequently, a first metal is to be formed. FIG. 2 is a cross-sectional view that illustrates the first metals 16a, 16b, and 16c. In this step, the first metals 16a, 16b, and 16c are formed on the opening section 12a, the semiconductor substrate 10 exposed via the opening section 12a, and the first resist 14, respectively. The first metal 16a is formed on the opening section 12a, the first metal 16b is formed on the semiconductor substrate 10, and the first metal 16c is formed on the first resist 14. The first metals 16a, 16b, and 16c are thinner than the insulation film 12. The first metals 16a, 16b, and 16c are preferably formed en bloc by a vapor deposition method or a sputtering method.

The semiconductor substrate 10 and the first metal 16b are preferably schottky-connected. For this purpose, a thin film Au in contact with the first metal 16b may be advantageously formed by a vapor deposition method or sputtering method. It should be noted that such a thin film Au may be omitted.

Figure 3:
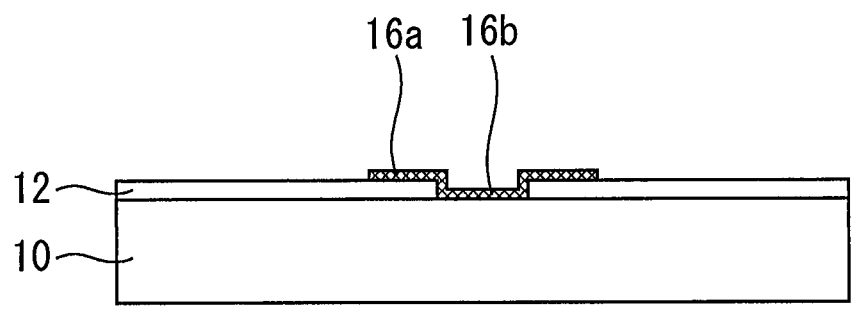
FIG. 3 is a cross-sectional view of the semiconductor device after having been subjected to a lift-off process.

Subsequently, a lift-off method is carried out. FIG. 3 is a cross-sectional view of the semiconductor device after having been subjected to a lift-off process. In this step, the first resist 14 and the first metal 16c on the first resist 14 are removed by the lift-off method. In this manner, the first metal 16b which is a metal thin film pattern is formed at a portion where a gate electrode of the semiconductor substrate 10 should be formed. In a case where the material of the semiconductor substrate 10 is GaN or AlGaN, the material of the first metals 16a and 16b is preferably made of any one of, or a combination of, nickel (Ni), platinum (Pt), tantalum nitride (TaN), tungsten (W), tungsten nitride (WN), palladium (Pd), and titanium nitride (TiN).

Figure 4:
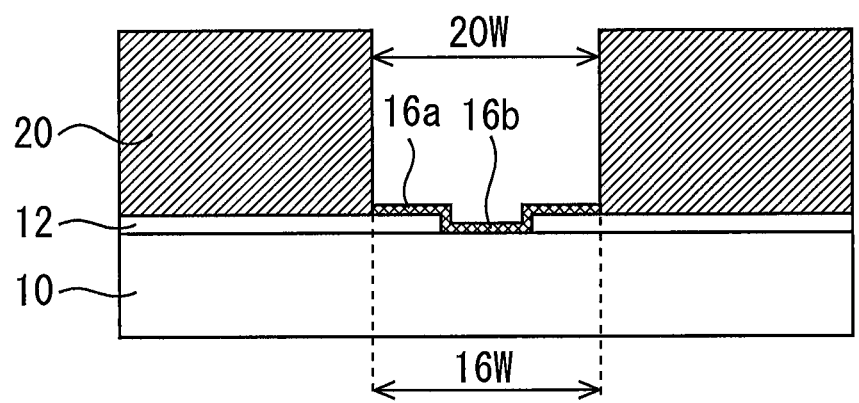
FIG. 4 is a cross-sectional view of the second resist.

Subsequently, a second resist is to be formed. FIG. 4 is a cross-sectional view of the second resist 20. In this step, on the insulation film 12, a second resist 20 is formed via which the first metals 16a and 16b are exposed. An opening width 20W of the second resist 20 should be equal to or larger than a width 16W of the first metals 16a and 16b. When the opening width 20W and the width 16W are equal to each other, the first metals 16a and 16b are exposed via the second resist 20. When the opening width 20W is larger than the width 16W, the insulation film 12 is exposed via the second resist 20 in addition to the first metals 16a and 16b.

Figure 5:
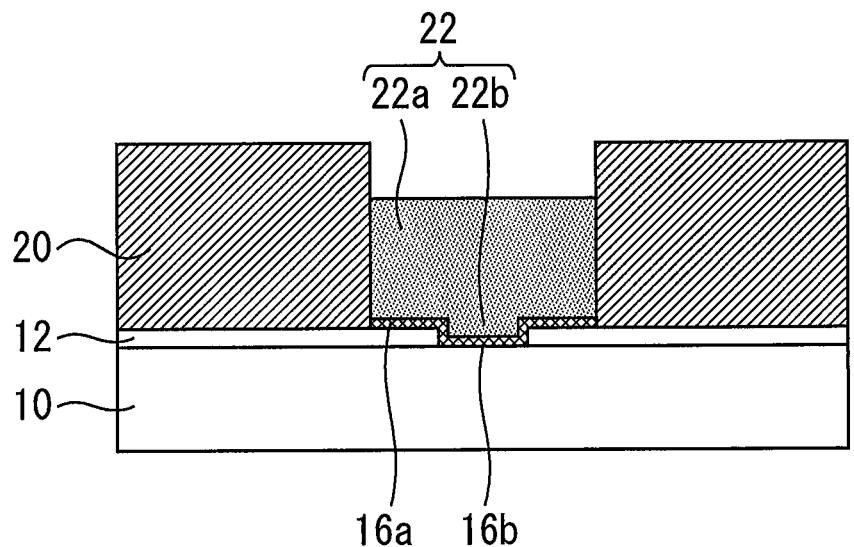
FIG. 5 is a cross-sectional view of the second metal.

Subsequently, an electroless plating process is to be performed. FIG. 5 is a cross-sectional view of the semiconductor device after the electroless plating process. In this step, an electroless plating method is used to cause the first metals 16a and 16b to grow a second metal 22. In order to allow the second metal 22 to have low resistance, the material of the second metal 22 is preferably made of gold (Au). For example, a material having a low resistivity such as cooper (Cu) may also be used. The second metal 22 has a first portion 22a in contact with the first metal 16a and a second portion 22b in contact with the first portion 22a and the first metal 16b. Since a film thickness of the second metal 22 is smaller than that of the second resist 20, the second metal 22 as a whole is below the upper surface of the second resist 20. Also, the width of the second portion 22b is substantially uniform.

Figure 6:
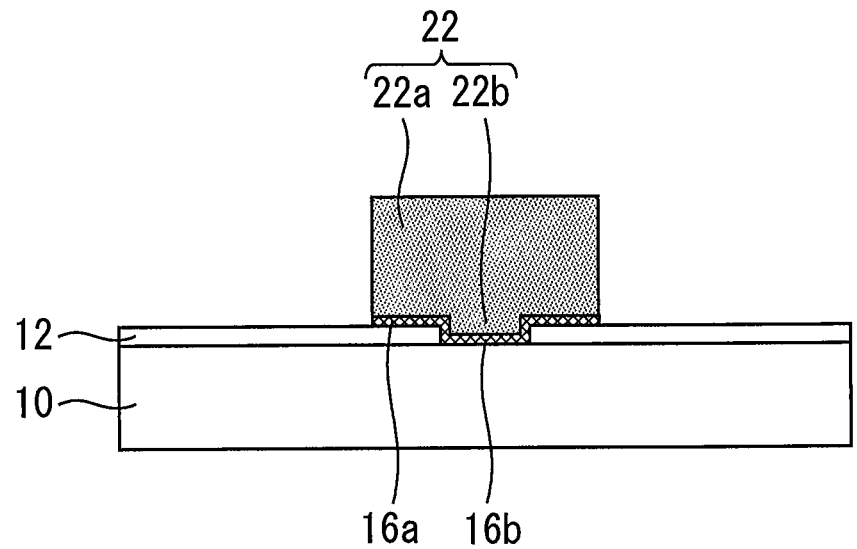
FIG. 6 is a cross-sectional view of the semiconductor device from which the second resist has been removed.

Subsequently, the second resist 20 is to be removed. FIG. 6 is a cross-sectional view of the semiconductor device from which the second resist has been removed. The second resist 20 is removed by a well-known method. For example, the second resist 20 can be removed by using an $O_2$ asher or a resist removal agent. In this manner, a gate electrode of a high frequency device having the first metals 16a and 16b and the second metal 22 is formed.

Figure 7:
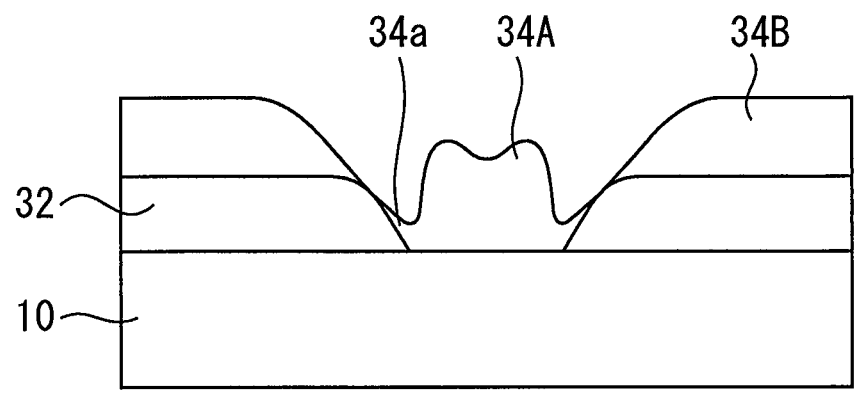
FIG. 7 is a cross-sectional view of a semiconductor device in accordance with the comparative example.

Here, a comparative example is described for facilitating understanding of the significance of the method of manufacturing a semiconductor device in accordance with Embodiment 1. FIG. 7 is a cross-sectional view of a semiconductor device in accordance with the comparative example. In the comparative example, an insulation film 32 is formed on a semiconductor substrate 10. In addition, electrodes 34A and 34B are formed by vapor deposition or sputtering. At this point, a footing portion 34a is created at the base of the electrode 34A. As has been described in the foregoing, when a footing portion is created at a base portion of a gate electrode, the size of the effective gate electrode increases and parasitic capacitance becomes large.

According to the method of manufacturing a semiconductor device in accordance with Embodiment 1, the first metals 16a and 16b are formed by a vapor deposition method or a sputtering method, and the second metal 22 is grown by an electroless plating method. Hence, a feeding layer removal step associated with an electrolytic plating process becomes unnecessary, so that damage to the semiconductor substrate 10 can be suppressed.

Also, the width of the gate electrode formed by the method of manufacturing a semiconductor device in accordance with Embodiment 1 is defined by the width of the second metal 22. A lift-off method is not used in the formation of the second metal 22 but an electroless plating method is used therefor. Hence, footing at the base of the electrode, which is the problem that the lift-off process involves, can be avoided. That is, the problem of the comparative example that the footing portion 34a is created does not arise. Also, by adjusting the size of the second resist 20, the size of the gate electrode can be readily controlled. Further, as compared to a case where a lift-off method is used, the width and the cross-sectional area of the gate electrode can be made larger.

By forming the second metal 22 using not a lift-off method according to which the thickness of the resist is limited but an electroless plating method, the second metal 22 can be formed to be thick. Hence, the height of the gate electrode can be ensured. These effects contribute to improvement in the high-frequency characteristics of the device.

In the context of the method of manufacturing a semiconductor device in accordance with Embodiment 1, various modifications thereto are possible within the range where the features thereof are not lost. For example, the gate electrode of Embodiment 1 may be formed as a gate electrode of a transistor other than HEMTs. The modifications described in the context of Embodiment 1 can also be applied to the methods of manufacturing a semiconductor device in accordance with the following embodiments. It should be noted that, since the methods of manufacturing a semiconductor device in accordance with the following embodiments have much in common with Embodiment 1, description thereof will focus on the features different from those of Embodiment 1.

Embodiment 2

Figure 8:
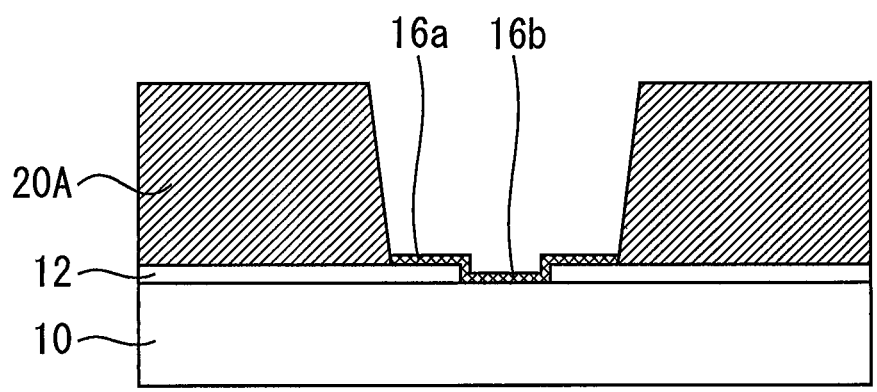
FIG. 8 is a cross-sectional view of the second resist in accordance with Embodiment 2.

The method of manufacturing a semiconductor device in accordance with Embodiment 2 is characterized by the shape of the second resist. FIG. 8 is a cross-sectional view of the second resist 20A in accordance with Embodiment 2. The opening width of the second resist 20A becomes smaller as it approaches the semiconductor substrate 10. By providing the side surface of the second resist 20A as a slope, the opening width of the second resist 20A becomes smaller as it approaches the semiconductor substrate 10. In other words, the second resist 20A is provided with a tapered shape.

Figure 9:
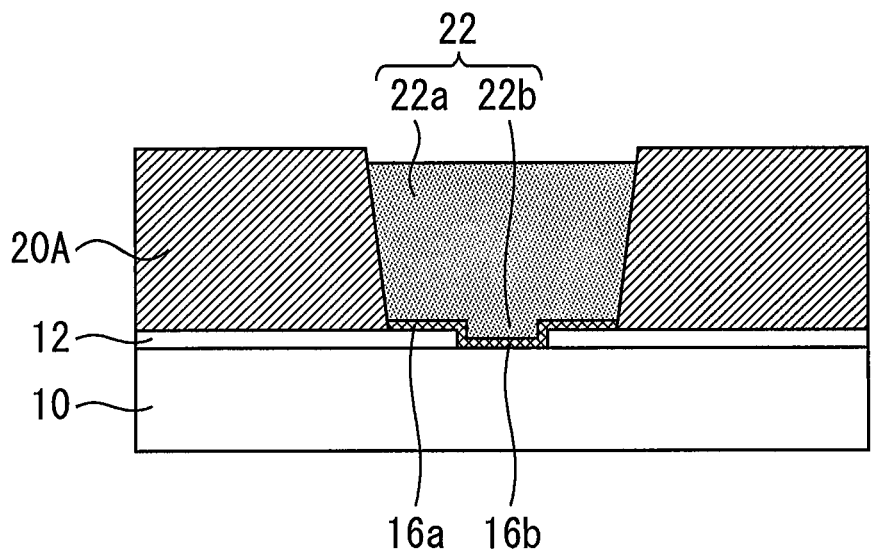
FIG. 9 is a cross-sectional view of the second metal.
Figure 10:
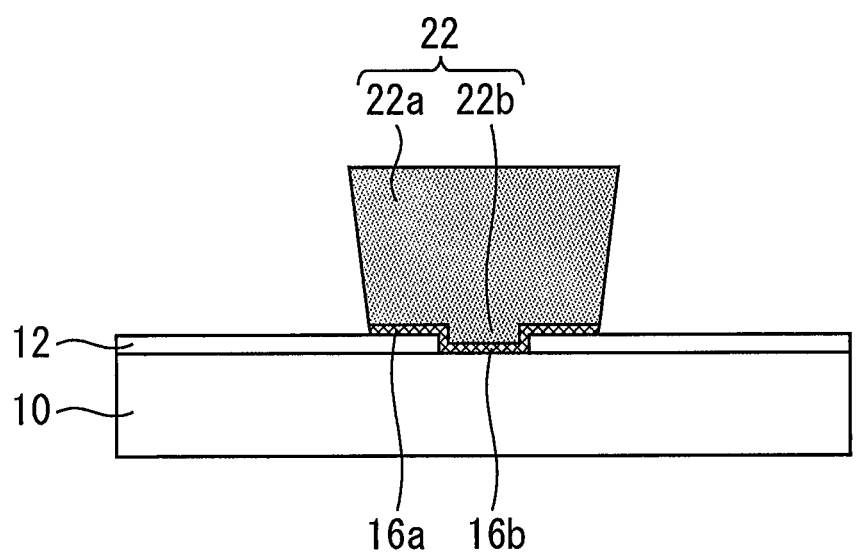
FIG. 10 is a cross-sectional view of the semiconductor device from which the second resist have been removed.

The process is made to proceed to the electroless plating after the second resist 20A has been formed. FIG. 9 is a cross-sectional view of the second metal 22 formed by electroless plating. The material of the second metal 22 is, for example, Au. Subsequently, by removing the second resist 20A, a gate electrode having the first metals 16a and 16b and the second metal 22 illustrated in FIG. 10 is created. The second metal 22 will have a shape whose thickness increases in the upward direction. In other words, the gate electrode will have a reverse tapered shape. By virtue of this, the volume of the gate electrode can be increased, so that the gate resistance can be further lowered.

By making the opening width of the second resist 20A smaller as it approaches the semiconductor substrate 10, the volume of the gate electrode can be increased. The shape of the second resist may be changed within the range where this feature is not deviated from. For example, the same effect can be obtained when the side surface of the second resist 20A is provided as a curved surface or in a stepped shape.

Embodiment 3

Figure 11:
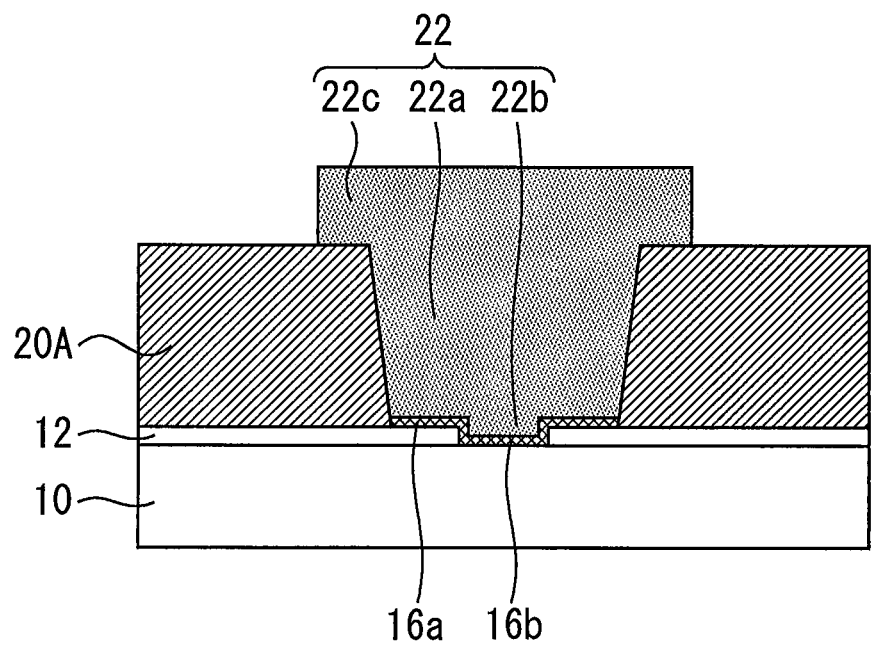
FIG. 11 is a cross-sectional view of the second metal in accordance with Embodiment 3.
Figure 12:
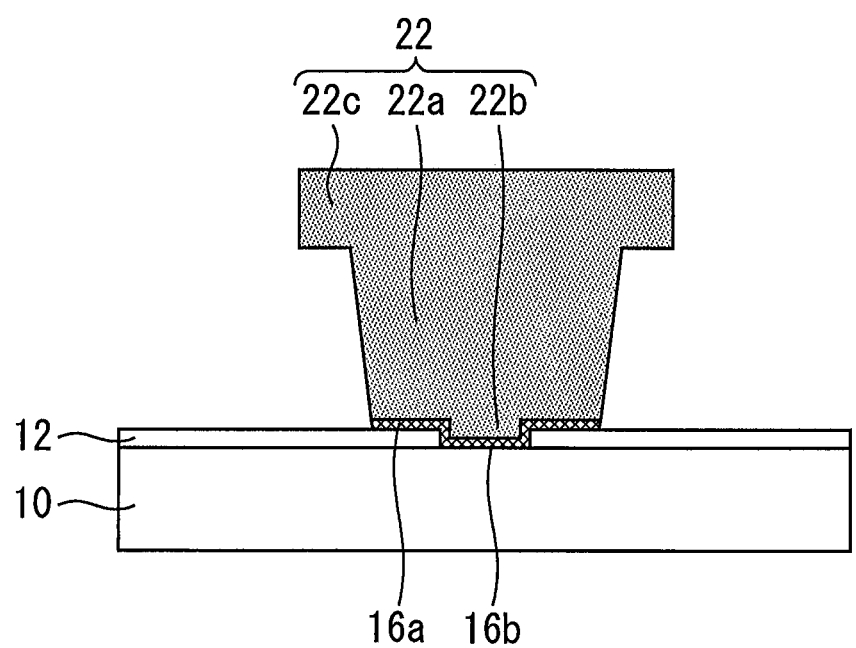
FIG. 12 is a cross-sectional view of the semiconductor device from which the second resist has been removed.

The method of manufacturing a semiconductor device in accordance with Embodiment 3 is characterized by the thickness of the second metal 22. FIG. 11 is a cross-sectional view of the second metal 22. The second metal 22 includes a third portion 22c in addition to the first portion 22a and the second portion 22b. The third portion 22c is formed on the second resist 20A. By forming the second metal 22 to be thicker than the second resist 20A, the third portion 22c can be formed. Specifically, the third portion 22c can be formed by continuing the electroless plating after the first portion 22a and the second portion 22b have been formed. The width of the third portion 22c is larger than the width of the first portion 22a. As a result, the gate electrode of Embodiment 3 will exhibit a mushroom shape. Subsequently, by removing the second resist 20A, the gate electrode illustrated in FIG. 12 is completed.

As illustrated in FIG. 11, the width of the third portion 22c is widened relative to the opening size of the second resist 20A. However, by adjusting the components of the plating solution, the width of the third portion 22c may be adapted such that it does not become wider than the opening size of the second resist 20A. In this case, the width of the third portion 22c is substantially identical with the opening width of the second resist 20A.

According to Embodiment 3, by making the second metal 22 sufficiently thicker than the second resist 20A, low resistance can be achieved on the gate resistance. It is preferable that the electroless plating is continued until the upper surface of the second metal 22 reaches an upper region that is higher than the upper surface of the second resist 20A.

Embodiment 4

For example, in a case of high voltage operation with a GaN-HMET, the potential distribution near the gate electrode becomes dense and electric field concentration occurs, which lowers the FET withstand voltage. As a countermeasure to this, it is effective to form a source field plate (SFP) electrode on the gate electrode. However, when the gate electrode is made in a reverse tapered shape or a mushroom shape as in Embodiments 2 and 3, it is difficult to form the SFP electrode around the gate electrode in a state where the step coverage state is favorable while ensuring a size controllability.

Figure 13:
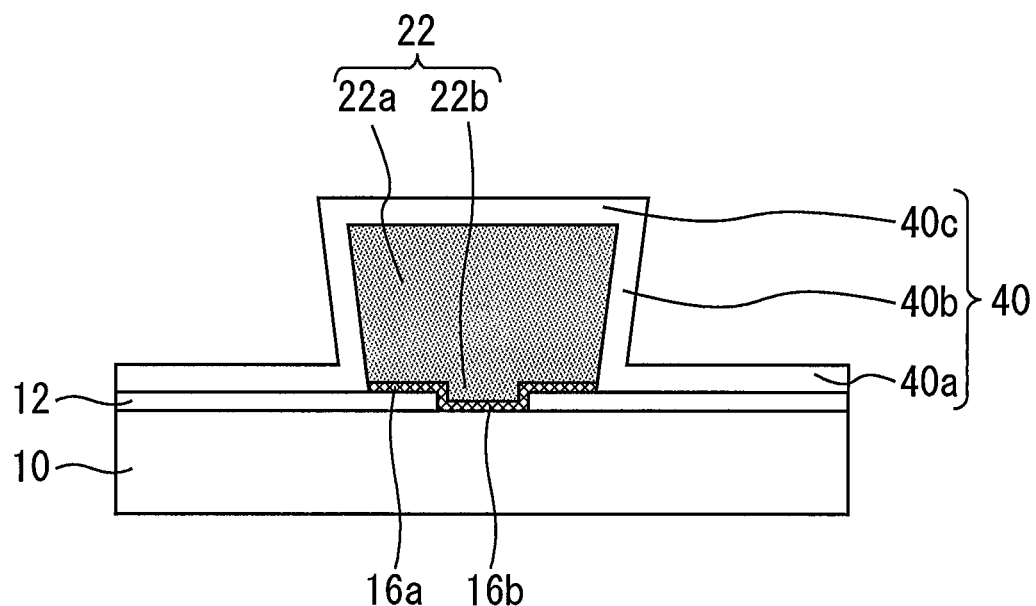
FIG. 13 is a cross-sectional view of the insulation protection film in accordance with Embodiment 4.

The method of manufacturing a semiconductor device in accordance with Embodiment 4 is a method of manufacturing an SPF electrode having a sufficient step coverage. First, after a gate electrode has been formed, an insulation protection film, which will constitute a gate electrode protection film, is formed. In FIG. 13, the insulation protection film 40 is disclosed. The insulation protection film 40 is to be formed after the second resist has been removed. The insulation protection film 40 has a first portion 40a on the insulation film 12, a second portion 40b formed on a side surface of the second metal 22, and a third portion 40c formed on the second metal 22.

The first portion 40a, the second portion 40b, and the third portion 40c are integrally formed. The insulation protection film 40 is a film that covers the second metal 22. The material of the insulation protection film 40 can be provided as an SiN film, an SiO film, or an $Al_2O_3$ film, or as another insulating material. It is preferable that the insulation protection film 40 be formed by a plasma chemical vapor deposition method, a thermal chemical vapor deposition method, a sputtering method, or an atomic layer deposition (ALD) method.

Figure 14:
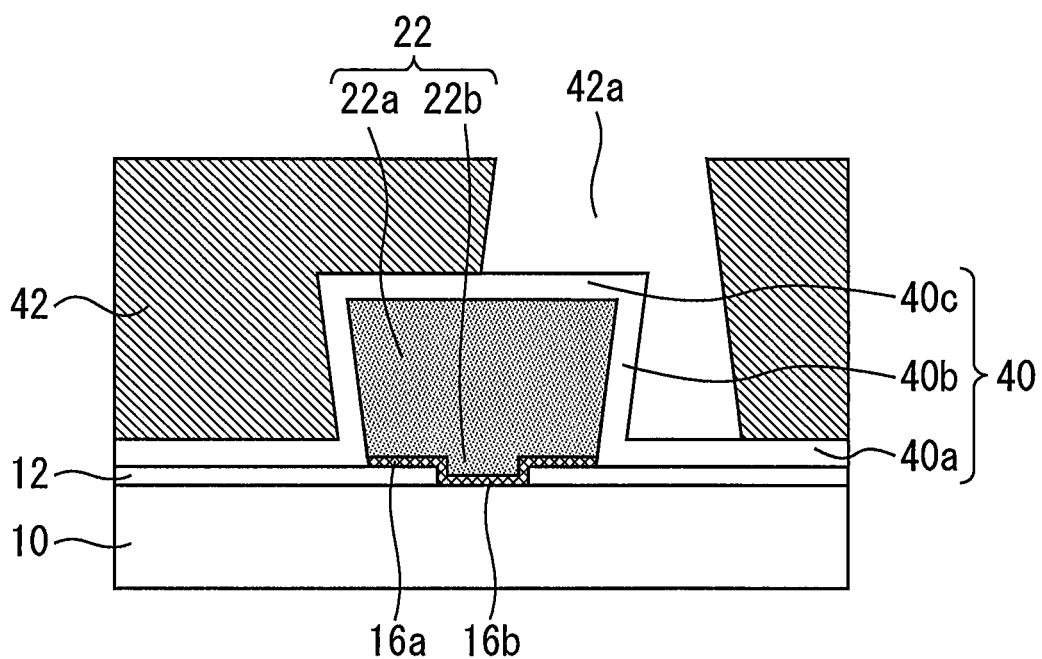
FIG. 14 is a cross-sectional view of the third resist.

Subsequently, a third resist is to be formed. FIG. 14 is a cross-sectional view of the third resist 42. The third resist 42 is formed on the semiconductor substrate 10 such that a part of the third portion 40c, a part of the second portion 40b, and a part of the first portion 40a are exposed.

Figure 15:
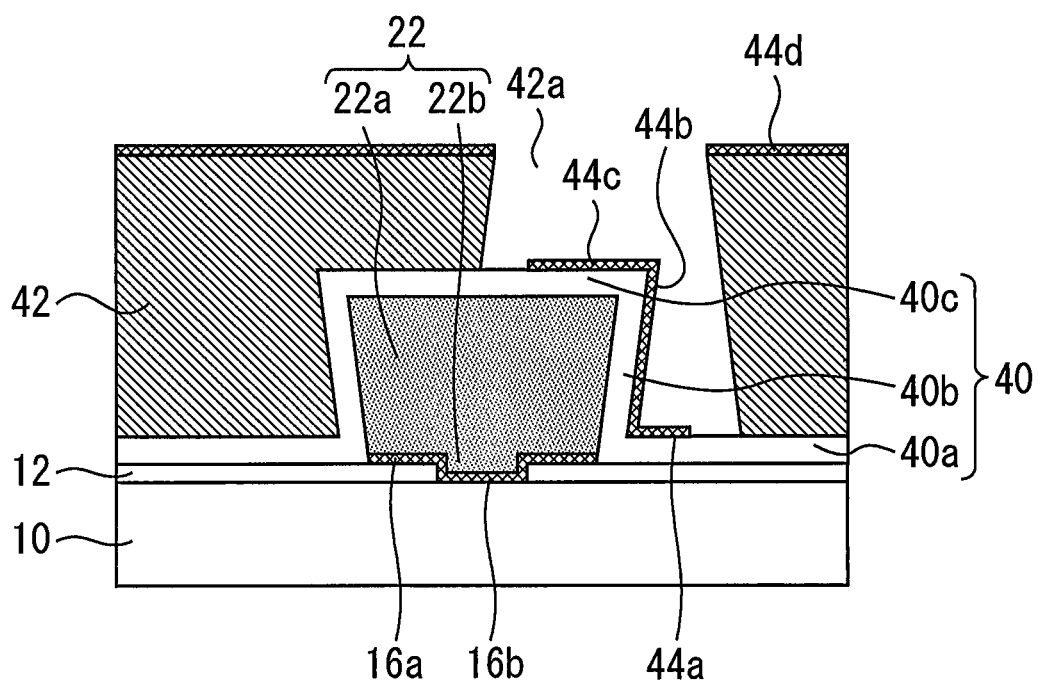
FIG. 15 is a cross-sectional view of the third metals.

Subsequently, a third metal is to be formed. FIG. 15 is a cross-sectional view that illustrates the third metals 44a, 44b, 44c, and 44d. The third metal 44a is formed on the first portion 40a. The third metal 44b is formed on the side surface of the second portion 40b. The third metal 44c is formed on the third portion 40c. The third metal 44d is formed on the third resist 42. These third metals 44a, 44b, 44c, and 44d are formed by a sputtering method or a vapor deposition method. The third metals 44a, 44b, and 44c are formed as an electrode material of the SFP electrode. The third metals 44a, 44b, and 44c are not electrically connected to the second metal 22 which is a gate electrode, but connected to the source electrode and will have the same potential as the source electrode.

Figure 16:
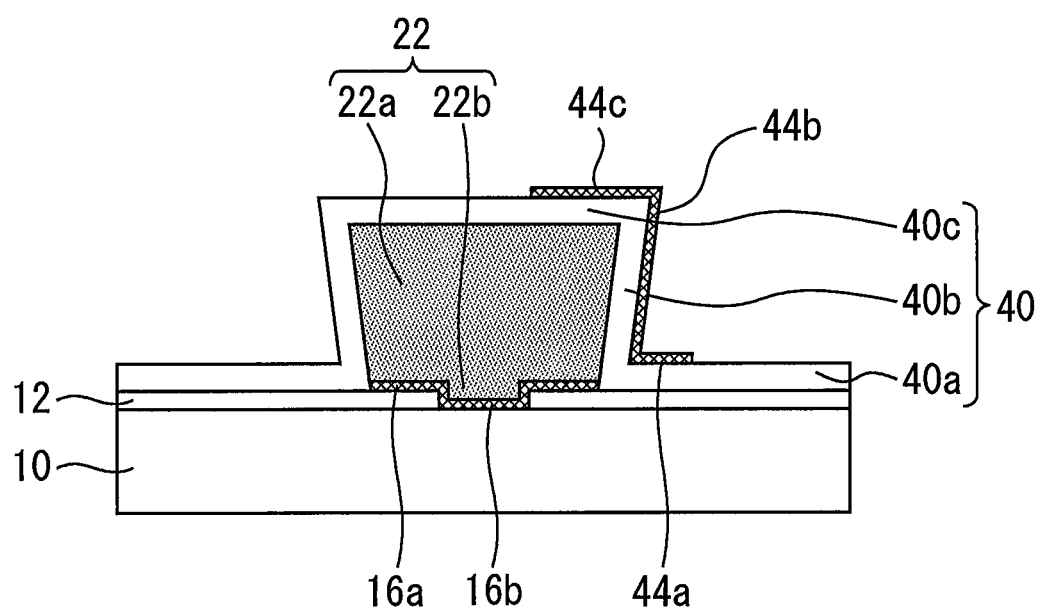
FIG. 16 is a cross-sectional view of the semiconductor device from which the third resist has been removed.

Subsequently, the third resist 42 is to be removed. FIG. 16 is a cross-sectional view of the semiconductor device from which the third resist 42 has been removed. The third resist 42 and the third metal 44d thereon are removed by lift-off. In this manner, by forming the third metals 44a, 44b, and 44c using the third resist 42, it is made possible to form an SFP electrode around a gate electrode with a favorable step coverage. Hence, even when the gate electrode has a shape which is difficult to achieve a step coverage such as a reverse tapered shape and a mushroom shape, the SFP electrode can be provided with favorable step coverage. It should be noted that, while the SFP electrode is formed on one single side of the gate electrode in Embodiment 4, an SFP electrode that covers the entire surface of the gate electrode may be formed.

Embodiment 5

Figure 17:
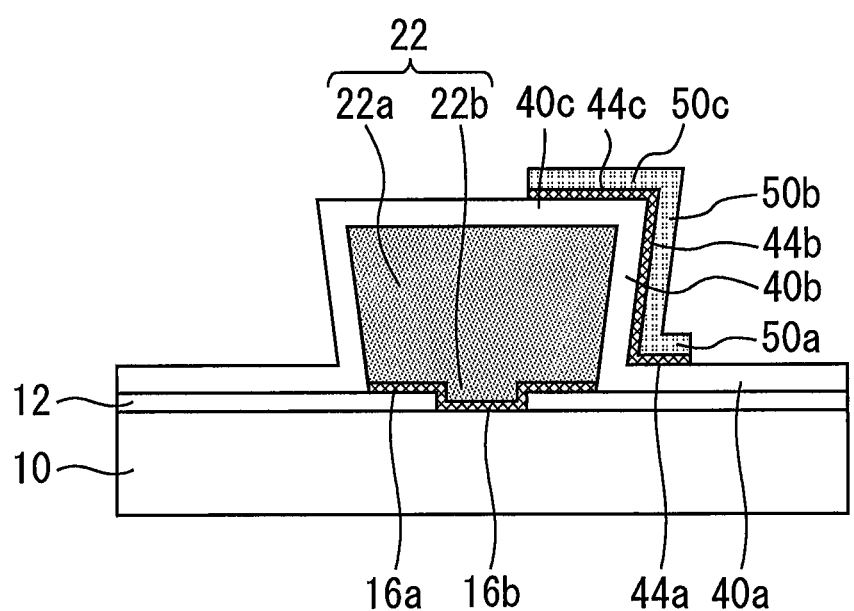
FIG. 17 is a cross-sectional view of the fourth metal in accordance with Embodiment 5.

The method of manufacturing a semiconductor device in accordance with Embodiment 5 is a method of carrying out electroless plating on the third metals 44a, 44b, and 44c formed in accordance with the method of manufacturing a semiconductor device of Embodiment 4 and thickening the electrode. FIG. 17 illustrates fourth metals 50a, 50b, and 50c in contact with the third metals 44a, 44b, and 44c. The fourth metals 50a, 50b, and 50c are formed by an electroless plating method.

In Embodiment 4, since the third metals 44a, 44b, and 44c are formed by a sputtering method or a vapor deposition method, voids are created when this is thickened. In view of this, in Embodiment 5, an SFP electrode is thickened by an electroless plating method. By virtue of this, it is made possible to form a thick void-free SFP electrode. Also, by forming the fourth metals 50a, 50b, and 50c by the electroless plating method, regardless of the film thickness of the SFP electrode, the step coverage of the SFP electrode can be increased. Accordingly, since the SFP electrode can be formed with a favorable step coverage in response to various shapes of gate electrodes, design flexibility is further enhanced.

It should be noted that the methods of manufacturing a semiconductor device that have been described in the above-described respective embodiments may be combined to enhance the effects.

DESCRIPTION OF SYMBOLS 10 semiconductor substrate, 12 insulation film, 14 first resist, 16a, 16b, 16c first metals, 20 second resist, 22 second metal

The invention claimed is:

1. A method of manufacturing a semiconductor device comprising in order of:
   forming, on a semiconductor substrate, an insulation film having an opening section where an opening is formed;
   forming a first resist on the insulation film while avoiding the opening section and the semiconductor substrate exposed via the opening section;
   forming a first metal on the opening section, the semiconductor substrate exposed via the opening section, and the first resist by a vapor deposition method or a sputtering method;
   removing, by a lift-off method, the first resist and the first metal on the first resist;
   forming, on the insulation film, a second resist allowing the first metal to be exposed, such that a side surface of the second resist is in direct contact with the first metal;
   causing the first metal to grow a second metal by an electroless plating method; and
   removing the second resist, wherein the first metal is thinner than the insulation film.

2. The method of manufacturing the semiconductor device according to claim 1, wherein the opening width of the second resist becomes smaller as the second resist approaches the semiconductor substrate.

3. The method of manufacturing the semiconductor device according to claim 1, wherein the second metal is formed to be thicker than the second resist.

4. A method of manufacturing a semiconductor device comprising in order of:
   forming, on a semiconductor substrate, an insulation film having an opening section where an opening is formed;
   forming a first resist on the insulation film while avoiding the opening section and the semiconductor substrate exposed via the opening section;
   forming a first metal on the opening section, the semiconductor substrate exposed via the opening section, and the first resist by a vapor deposition method or a sputtering method;
   removing, by a lift-off method, the first resist and the first metal on the first resist;
   forming, on the insulation film, a second resist allowing the first metal to be exposed;
   causing the first metal to grow a second metal by an electroless plating method; and
   removing the second resist, wherein the opening width of the second resist becomes smaller as the second resist approaches the semiconductor substrate, and wherein a side surface of the second resist is in contact with the first metal.

5. The method of manufacturing the semiconductor device according to claim 4, comprising:
   forming an insulation protection film covering the second metal after removing the second resist;
   forming, on the semiconductor substrate, a third resist via which the insulation protection film formed on the second metal and the insulation protection film formed on a side surface of the second metal are exposed;
   forming a third metal on the insulation protection film; and
   removing the third resist,
   wherein the insulation protection film is formed by a plasma chemical vapor deposition (CVD) method, a thermal chemical vapor deposition method, a sputtering method, or an atomic layer deposition (ALD) method, and the third metal is formed by the sputtering method or the vapor deposition method.

6. The method of manufacturing the semiconductor device according to claim 5, comprising forming a fourth metal in contact with the third metal by an electroless plating method.

7. The method of manufacturing the semiconductor device according to claim 4, wherein the second metal is formed to be thicker than the second resist.

8. A method of manufacturing a semiconductor device comprising in order of:
   forming, on a semiconductor substrate, an insulation film having an opening section where an opening is formed;
   forming a first resist on the insulation film while avoiding the opening section and the semiconductor substrate exposed via the opening section;
   forming a first metal on the opening section, the semiconductor substrate exposed via the opening section, and the first resist by a vapor deposition method or a sputtering method;
   removing, by a lift-off method, the first resist and the first metal on the first resist;
   forming, on the insulation film, a second resist allowing the first metal to be exposed;
   causing the first metal to grow a second metal by an electroless plating method; and
   removing the second resist, wherein the second metal is formed to be thicker than the second resist, and wherein a side surface of the second resist is in contact with the first metal.

9. The method of manufacturing the semiconductor device according to claim 8, comprising:
   forming an insulation protection film covering the second metal after removing the second resist;
   forming, on the semiconductor substrate, a third resist via which the insulation protection film formed on the second metal and the insulation protection film formed on a side surface of the second metal are exposed;
   forming a third metal on the insulation protection film; and
   removing the third resist.

* * * * *